US012811558B2

(12) United States Patent
Kishimoto et al.

(10) Patent No.: US 12,811,558 B2
(45) Date of Patent: Nov. 24, 2026

(54) ACOUSTIC WAVE DEVICE

(71) Applicant: Murata Manufacturing Co., Ltd., Nagaokakyo (JP)

(72) Inventors: Yutaka Kishimoto, Nagaokakyo (JP); Masashi Omura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 820 days.

(21) Appl. No.: 18/319,505

(22) Filed: May 18, 2023

(65) Prior Publication Data

US 2023/0387879 A1 Nov. 30, 2023

Related U.S. Application Data

(63) Continuation of application No. PCT/JP2021/040618, filed on Nov. 4, 2021.

(30) Foreign Application Priority Data

Nov. 20, 2020 (JP) ................................ 2020-193490

(51) Int. Cl.
*H03H 9/02* (2006.01)
*H03H 3/02* (2006.01)
*H03H 9/17* (2006.01)

(52) U.S. Cl.
CPC .......... *H03H 9/02015* (2013.01); *H03H 3/02* (2013.01); *H03H 9/173* (2013.01)

(58) Field of Classification Search
CPC ...... H03H 9/02015; H03H 3/02; H03H 9/173; H03H 2003/023; H03H 9/02102; H03H 9/02118; H03H 9/02228; H03H 9/174
USPC ......................... 333/133, 186–188, 193–196
See application file for complete search history.

(56) References Cited

U.S. PATENT DOCUMENTS

2021/0146402 A1* 5/2021 Kishimoto ........... H10N 30/875
2021/0281243 A1* 9/2021 Sui ........................... H03H 9/56

FOREIGN PATENT DOCUMENTS

JP 2010-045437 A 2/2010
JP 2011-091639 A 5/2011
JP 2013-223025 A 10/2013
JP 2018-170343 A 11/2018
WO 2019/102951 A1 5/2019
WO 2019/124128 A1 6/2019
WO 2020/026735 A1 2/2020

OTHER PUBLICATIONS

International Search Report and Written Opinion mailed on Jan. 18, 2022, received for PCT Application PCT/JP2021/040618, filed on Nov. 4, 2021, 12 pages including English Translation.

* cited by examiner

*Primary Examiner* — Jorge L Salazar, Jr.
(74) *Attorney, Agent, or Firm* — XSENSUS LLP

(57) ABSTRACT

An acoustic wave device includes an intermediate film, a piezoelectric film 4, and a first electrode, which are laminated in this order on a support substrate. A void portion is provided to overlap at least a part of the first electrode on the side of a second main surface of the piezoelectric film in plan view from the side of a first main surface. A groove portion is also provided to pass through at least a part of the piezoelectric film but not reach the void portion.

18 Claims, 9 Drawing Sheets

ACOUSTIC WAVE DEVICE

CROSS-REFERENCE TO RELATED APPLICATIONS

This application claims priority to international application no. PCT/JP2021/040618, filed Nov. 4, 2021, which claims priority to Japanese application no. JP 2020-193490, filed Nov. 20, 2020. The entire contents of the prior applications are hereby incorporated herein by reference.

TECHNICAL FIELD

The present disclosure relates to an acoustic wave device having a void portion below a piezoelectric film.

BACKGROUND ART

Patent Document 1 below describes a piezoelectric device having a void portion. In this piezoelectric device, an electrode is provided on each of the upper surface and the lower surface of a piezoelectric body. In addition, the void portion is provided below the piezoelectric body. A pass-through portion having a substantially frame-like shape is provided outside the region in which the upper electrode and the lower electrode face each other. This pass-through portion passes through the piezoelectric film that excludes a drawn electrode portion and reaches the void portion.

CITATION LIST

Patent Document

Patent Document 1: International Publication No. 2019/102951

SUMMARY

Technical Problem

In the piezoelectric device described in Patent Document 1, the piezoelectric body portion surrounded by the pass-through portion having a substantially frame-like shape undergoes flexural vibration. The characteristics of the flexural vibration are improved because the pass-through portion is provided. However, since the pass-through portion is provided, there is a problem in that mechanical strength is insufficient. For example, in an acoustic wave device or the like, when the thickness of the piezoelectric body is smaller, a decrease in mechanical strength becomes a more notable problem.

One aspect of the present disclosure is to provide an acoustic wave device having both improved characteristics and enhanced mechanical strength.

Exemplary Solution to Problem

In one exemplary aspect of the present disclosure, there is provided an acoustic wave device including: a support substrate; an intermediate film provided on the support substrate; a piezoelectric film provided on the intermediate film, the piezoelectric film having a first main surface and a second main surface that face away from the first main surface; and a first electrode provided on the first main surface of the piezoelectric film, in which, in plan view from the first main surface of the piezoelectric film, on a side of the second main surface of the piezoelectric film, a void portion is provided to overlap at least a part of the first electrode, and a groove portion is provided to pass through at least a part of the piezoelectric film but not reach the void portion.

Advantageous Effects

Exemplary advantages of the present disclosure include an acoustic wave device having improved characteristics and enhanced mechanical strength.

DETAILED DESCRIPTION

The present disclosure will be clarified by describing exemplary embodiments of the present disclosure with reference to the drawings.

It should be noted that the embodiments described in this specification are exemplary and that partial replacement or combinations of the structures of different embodiments are possible without departing from the scope of the present disclosure.

Figure 1A:
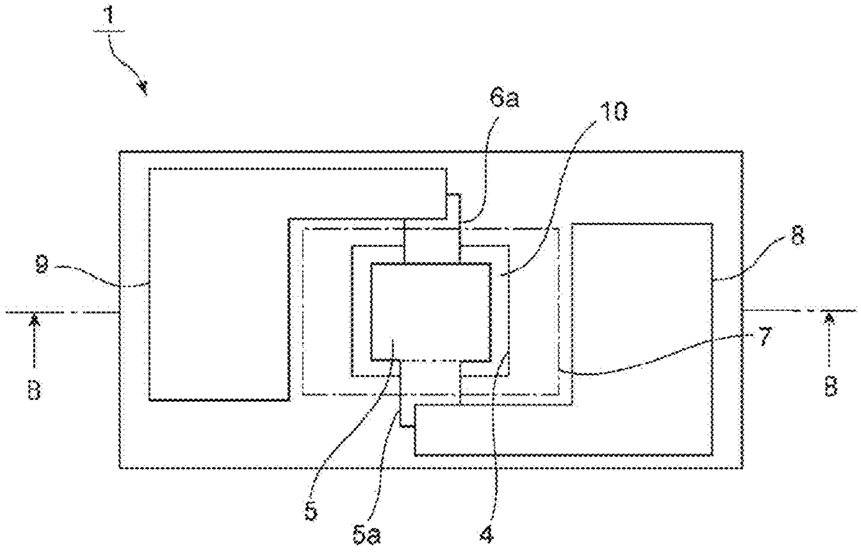
FIG. 1A is a plan view of an acoustic wave device according to a first exemplary embodiment of the present disclosure.
Figure 1B:
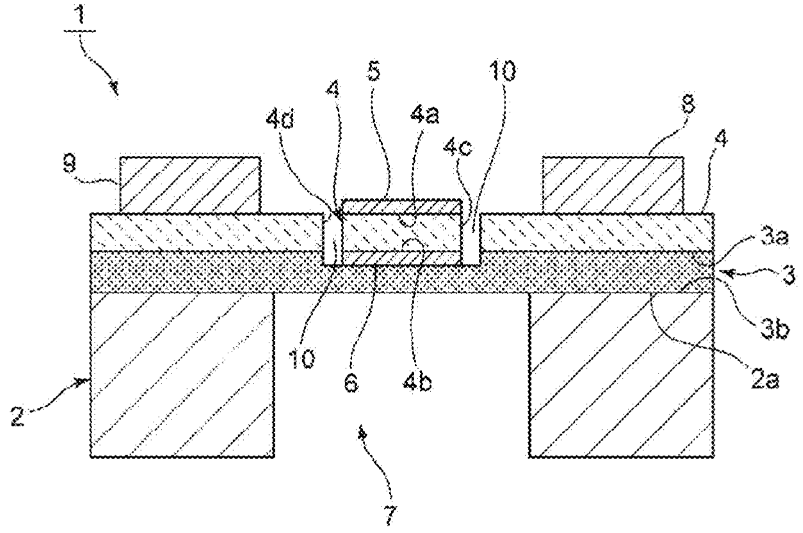
FIG. 1B is a front sectional view taken along line B-B in FIG. 1A.

FIG. 1A is a plan view of an acoustic wave device according to a first exemplary embodiment of the present disclosure, and FIG. 1B is a front sectional view taken along line B-B in FIG. 1A.

An acoustic wave device 1 includes a support substrate 2. The support substrate 2 is made of Si. However, the support substrate 2 may include a semiconductor other than Si and an appropriate dielectric such as and $Al_2O_3$.

The support substrate 2 has a void portion 7 that is open in an upper surface 2*a*. The void portion 7 passes through the support substrate 2 and reaches the lower surface thereof in the exemplary embodiment but may be a concave portion that does not reach the lower surface of the support substrate 2.

An intermediate film 3 is provided on an upper surface 2*a* of the support substrate 2. The intermediate film 3 is made of an appropriate dielectric. In the exemplary embodiment, the intermediate film 3 is made of silicon oxide. In this case, the temperature characteristics of the acoustic wave device can be easily improved. It should be noted that the intermediate film 3 may be made of an organic material without departing from the scope of the present disclosure. In this case, the acoustic wave device 1 can be easily manufactured. The intermediate film 3 has a lower surface 3*b* in contact with the upper surface 2*a* of the support substrate 2 and an upper surface 3*a* facing away from the lower surface 3*b*. The piezoelectric film 4 is laminated on the upper surface 3*a*. The piezoelectric film 4 is made of a piezoelectric monocrystal or a piezoelectric ceramic. Preferably, the piezoelectric film 4 is made of a piezoelectric monocrystal of lithium niobate, lithium tantalate, quartz, or the like. In the exemplary embodiment, the piezoelectric film 4 is made of lithium niobate.

The piezoelectric film 4 has a first main surface 4*a* and a second main surface 4*b* that face away from each other. The second main surface 4*b* is laminated on the upper surface 3*a* of the intermediate film 3.

A multilayer body including the piezoelectric film 4 and the intermediate film 3 has a groove portion 10 that extends from the first main surface 4*a* of the piezoelectric film 4 toward the intermediate film 3.

As illustrated in FIG. 1A, the groove portion 10 has a substantially rectangular frame shape.

In addition, as illustrated in FIG. 1B, the bottom surface of the groove portion 10 is lower than the upper surface 3*a* of the intermediate film 3. That is, the groove portion 10 reaches the inside of the intermediate film 3.

A first electrode 5 is provided on the first main surface 4*a* of the piezoelectric film 4 in the region surrounded by the groove portion 10. In addition, a second electrode 6 is provided on the second main surface 4*b*. As illustrated in FIG. 1A, a drawn electrode portion 5*a* is continuous with the first electrode 5. Similarly, as illustrated in FIG. 1A, a drawn electrode portion 6*a* is also continuous with the second electrode 6.

The first electrode 5 and the second electrode 6 have rectangular shapes. In addition, an exciting portion is formed by the portion in which the first electrode 5 overlaps the second electrode 6 via the piezoelectric film 4.

The piezoelectric film 4 has a first end surface 4*c* located on the side of the first electrode 5 and a second end surface 4*d* located on the side opposite to the first electrode 5 with the groove portion 10 sandwiched therebetween. That is, the groove portion 10 is surrounded by the first end surface 4*c*, the second end surface 4*d*, and the bottom surface of the groove portion 10. Although not particularly limited, in the exemplary embodiment, the first end surface 4*c* is flush with the side surface of the first electrode 5 that faces the groove portion 10, that is, a part of the side surface of the first electrode 5.

On the first main surface 4*a* of the piezoelectric film 4, terminal electrodes 8 and 9 are provided outside the region in which the void portion 7 is provided. The terminal electrode 8 is connected to the drawn electrode portion 5*a*. The terminal electrode 9 is connected to the drawn electrode portion 6*a*. The terminal electrodes 8 and 9 are used to electrically connect to the outside.

The first and second electrodes 5 and 6 and the terminal electrodes 8 and 9 are made of suitable metals or alloys including, for example, Al, AlCu, and Ti.

When an AC electric field from the terminal electrodes 8 and 9 is applied to the acoustic wave device 1, the exciting portion vibrates and generates an acoustic wave. The acoustic wave device 1 can be used as a resonator by using the resonance property of the acoustic wave.

It should be noted that the thickness of the piezoelectric film 4 is not particularly limited but is usually approximately 100 nm to several micrometers. In addition, the thickness of the intermediate film 3 is also not particularly limited but is approximately 100 nm to several micrometers.

In addition, the flat area of the exciting portion is not particularly limited but is approximately 0.04 $\mu m^2$ or less. In this case, a bulk wave as an acoustic wave can be effectively excited by the exciting portion, and the resonance characteristics due to the bulk wave can be used.

In particular, in plan view from the first main surface 4*a* of the piezoelectric film 4, the exciting portion, that is, at least a part of the first electrode 5, overlaps the void portion 7, and the region that overlaps the void portion 7 in plan view has the groove portion 10. Accordingly, an acoustic wave can be effectively excited by the exciting portion to improve characteristics. In addition, the groove portion 10 does not pass through the intermediate film 3 and does not reach the void portion 7. That is, in plan view, the groove portion 10 is provided so as to pass through at least a part of the piezoelectric film 4 and not reach the void portion 7 in the region that overlaps the void portion 7. Accordingly, mechanical strength can also be enhanced.

Furthermore, in the acoustic wave device 1, the first end surface 4*c* is flush with a part of the side surface of the first electrode 5. In this structure, characteristics can be further improved by more effectively exciting an acoustic wave in the exciting portion.

In the present disclosure, as described above, characteristics can be improved by providing the groove portion, and mechanical strength can be improved despite providing the groove portion.

FIGS. 2A to 2C and FIGS. 3A to 3D are front sectional views for describing the manufacturing method of the acoustic wave device according to the first exemplary embodiment of the present disclosure.

Figure 2A:
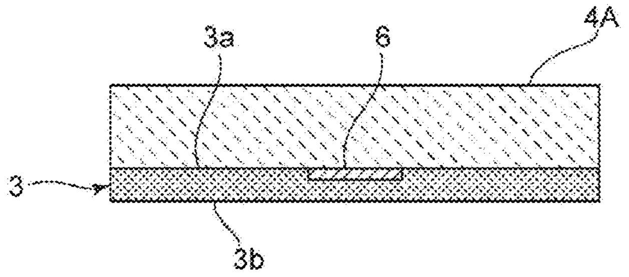
FIG. 2A is a front sectional view for describing the manufacturing method of the acoustic wave device according to the first exemplary embodiment of the present disclosure.

First, as illustrated in FIG. 2A, the second electrode 6 is formed on a piezoelectric wafer 4A. The intermediate film 3 is laminated on this piezoelectric wafer 4A.

Figure 2B:
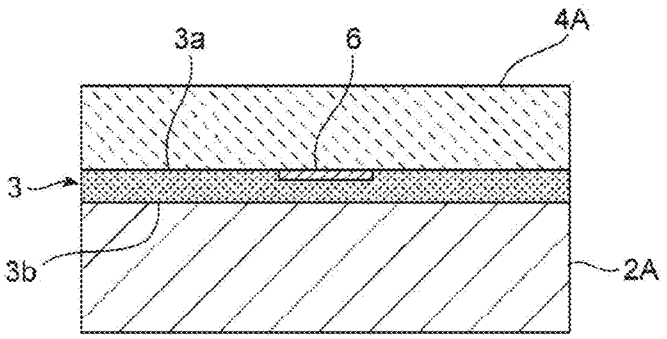
FIG. 2B is another front sectional view for describing the manufacturing method of the acoustic wave device according to the first exemplary embodiment of the present disclosure.

Next, as illustrated in FIG. 2B, a support substrate material 2A is laminated on the lower surface 3*b* of the intermediate film 3.

Figure 2C:
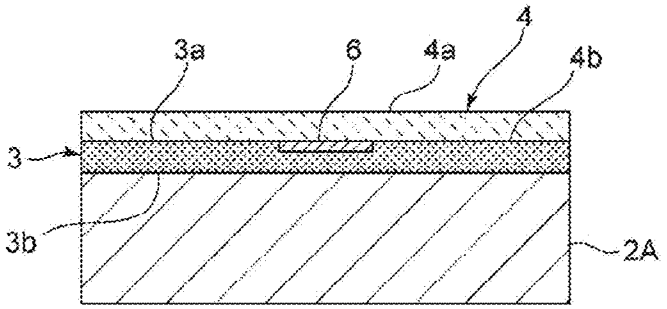
FIG. 2C is a further front sectional view for describing the manufacturing method of the acoustic wave device according to the first exemplary embodiment of the present disclosure.

After that, the piezoelectric wafer 4A is thinned by grinding, etching, or the like. In this way, as illustrated in FIG. 2C, a structure in which the thin piezoelectric film 4 is laminated on the intermediate film 3 is obtained.

Figure 3A:
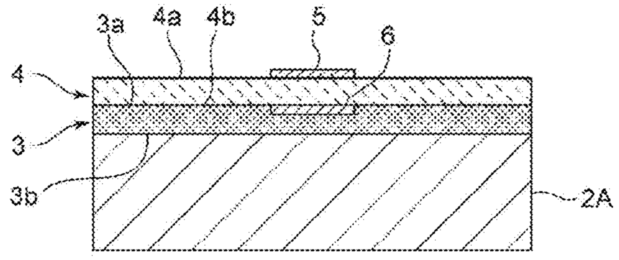
FIG. 3A is a front sectional view for describing the manufacturing method of the acoustic wave device according to the first exemplary embodiment of the present disclosure.

Next, as illustrated in FIG. 3A, the first electrode 5 is provided on the first main surface 4*a* of the piezoelectric film 4.

Figure 3B:
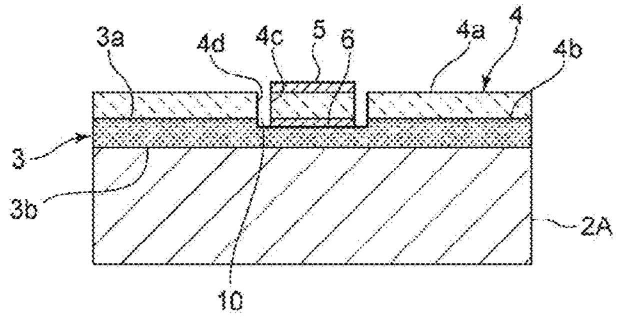
FIG. 3B is another front sectional view for describing the manufacturing method of the acoustic wave device according to the first exemplary embodiment of the present disclosure.

Next, as illustrated in FIG. 3B, the groove portion 10 is provided by etching or cutting.

Figure 3C:
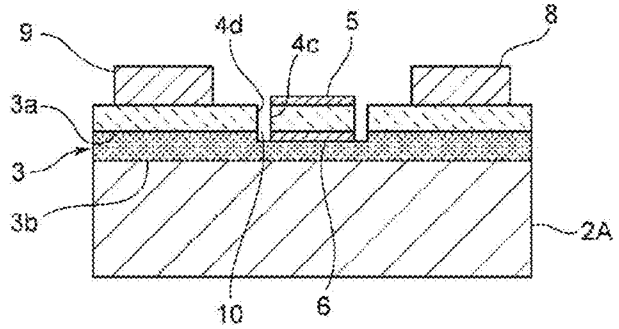
FIG. 3C is a further sectional view for describing the manufacturing method of the acoustic wave device according to the first exemplary embodiment of the present disclosure.

After that, as illustrated in FIG. 3C, the terminal electrodes 8 and 9 are provided. The terminal electrodes 8 and 9 can be formed by photolithography or the like.

Figure 3D:
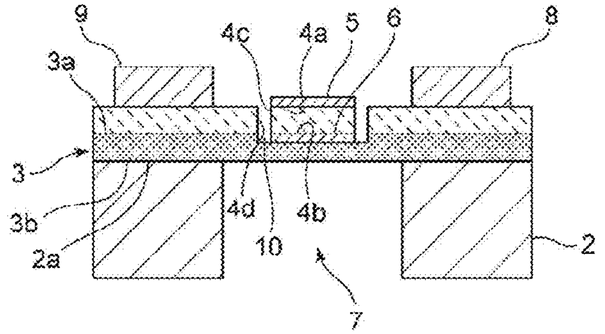
FIG. 3D is a still further sectional view for describing the manufacturing method of the acoustic wave device according to the first exemplary embodiment of the present disclosure.

Finally, as illustrated in FIG. 3D, the support substrate material 2A is machined from the lower surface to provide the void portion 7. This machining can be performed by DRIE machining, laser irradiation, mechanical machining, or the like.

Since the manufacturing method described above can be used in the acoustic wave device 1, the depth of the groove portion 10 can be easily controlled when forming the groove portion 10. Accordingly, the groove portion 10 that does not reach the void portion 7 can be easily formed with great certainty.

It should be noted that, in the acoustic wave device 1, at least a part of the groove portion 10 may be disposed in a cleavage plane of the piezoelectric film 4. When an anisotropic piezoelectric monocrystal substrate including lithium niobate, lithium tantalate, crystal, or the like is used as the piezoelectric film 4, formation of the groove portion 10 in the cleavage plane, in which a crack may easily occur, can suppress a crack from occurring, and mechanical strength is enhanced.

Figure 4:
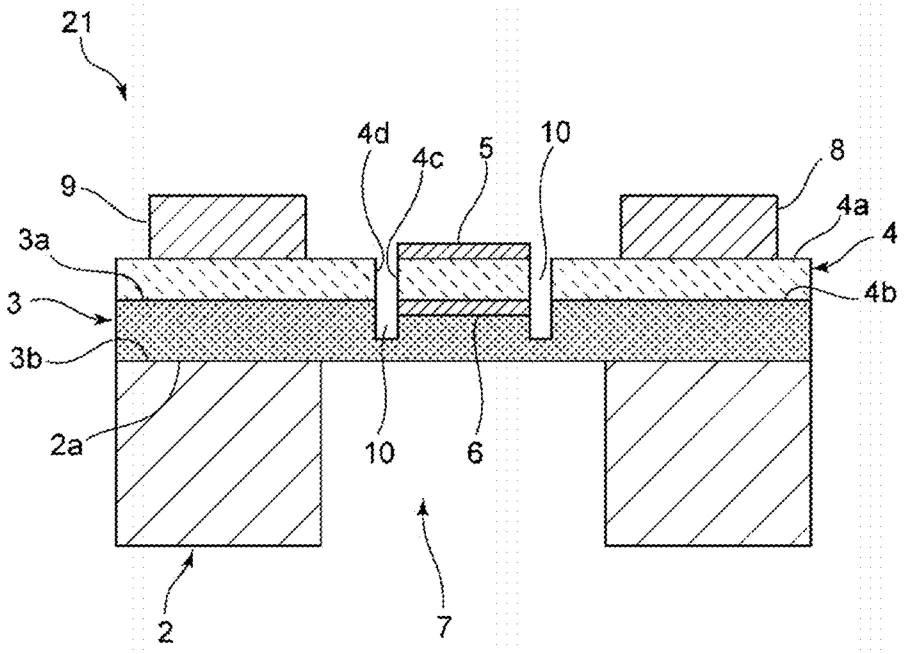
FIG. 4 is a front sectional view of an acoustic wave device according to a second exemplary embodiment of the present disclosure.

FIG. 4 is a front sectional view of an acoustic wave device according to a second exemplary embodiment of the present disclosure.

In an acoustic wave device 21, the depth of the groove portion 10 is greater than the depth of the groove portion 10 of the acoustic wave device 1 according to the first exemplary embodiment. That is, as illustrated in FIG. 1B, in the first exemplary embodiment, the bottom surface of the groove portion 10 is flush with the lower surface of the second electrode 6. On the other hand, in the acoustic wave device 21, the bottom surface of the groove portion 10 is lower than the lower surface of the second electrode 6 and reaches a lower portion in the intermediate film 3. As described above, the depth of the groove portion 10 may reach any position in the intermediate film 3. Even in this case, mechanical strength can be effectively enhanced because the groove portion 10 does not reach the void portion 7.

Figure 5:
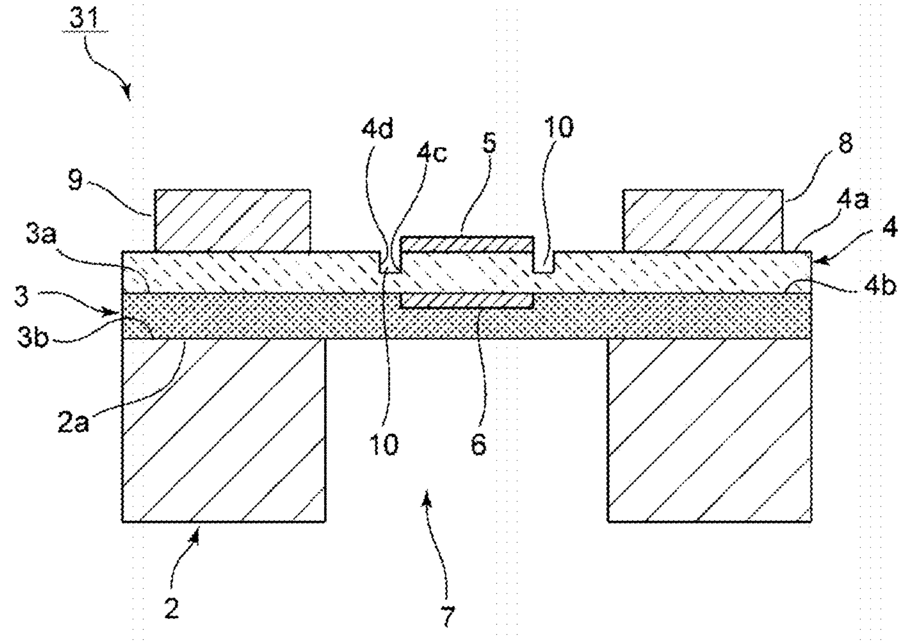
FIG. 5 is a front sectional view of an acoustic wave device according to a third exemplary embodiment of the present disclosure.

FIG. 5 is a front sectional view of an acoustic wave device 31 according to a third exemplary embodiment of the present disclosure. In the third exemplary embodiment, the groove portion 10 is formed within the piezoelectric film 4 and does not reach the intermediate film 3. That is, the bottom surface of the groove portion 10 is present within the piezoelectric film 4. In this case, mechanical strength can be further enhanced. As described above, in the present disclosure, the depth of the groove portion 10 is not particularly limited as long as the groove portion 10 does not reach the inside of the void portion 7.

Figure 6:
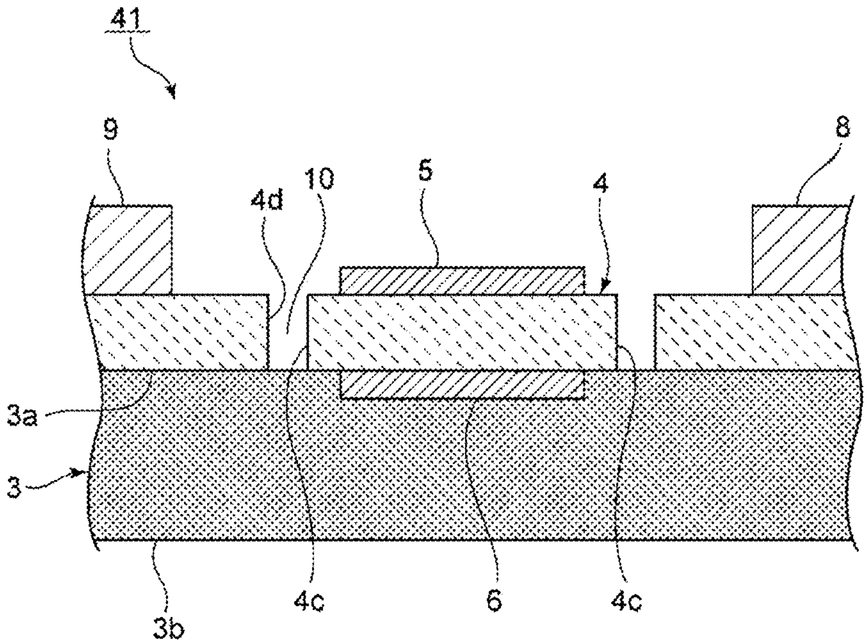
FIG. 6 is a partial cutaway front sectional view for describing a main portion of an acoustic wave device according to a fourth exemplary embodiment of the present disclosure.

FIG. 6 is a partial cutaway front sectional view for describing a main portion of an acoustic wave device according to a fourth exemplary embodiment of the present disclosure.

In an acoustic wave device 41, the bottom surface of the groove portion 10 is flush with the interface between the piezoelectric film 4 and the intermediate film 3. As described above, the bottom surface of the groove portion 10 may be located at the interface between the piezoelectric film 4 and the intermediate film 3. Even in this case, characteristics can be improved and mechanical strength can be enhanced at the same time.

In addition, in the acoustic wave device 41, the groove portion 10 is located outside the exciting portion in which the first electrode 5 and the second electrode 6 face each other. That is, the first end surface 4*c* of the piezoelectric film 4 exposed to the groove portion 10 is located outside the outer peripheral edge of the first electrode 5. As described above, the groove portion 10 need not be in contact with the exciting portion and may be located outside the exciting portion. In this structure, since stress does not concentrate on the interface between the first end surface 4*c* and the first electrode 5 or the piezoelectric film 4, peeling between the piezoelectric film 4 and the first electrode 5 is less likely to occur.

Figure 7:
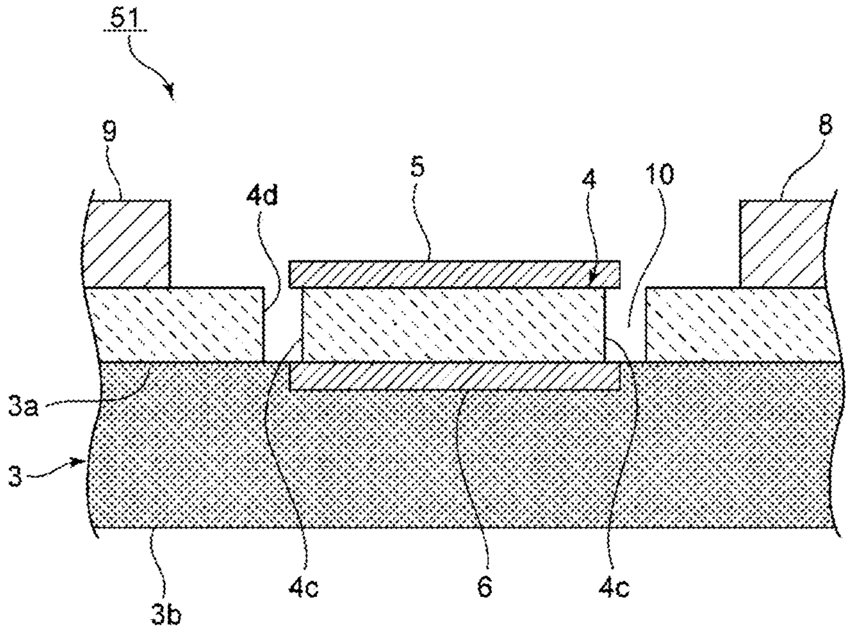
FIG. 7 is a partial cutaway front sectional view for describing a main portion of an acoustic wave device according to a fifth exemplary embodiment of the present disclosure.

FIG. 7 is a partial cutaway front sectional view for describing a main portion of an acoustic wave device according to a fifth exemplary embodiment of the present disclosure.

In an acoustic wave device 51, the first end surface 4*c* of the piezoelectric film 4 exposed to the groove portion 10 is located inside the region in which the first electrode 5 and the second electrode 6 face each other. As described above, the first end surface 4*c* of the piezoelectric film 4 may be located inside the outer peripheral edge of the first electrode 5. Even in this case, characteristics can be improved and mechanical strength can be enhanced.

Figure 8:
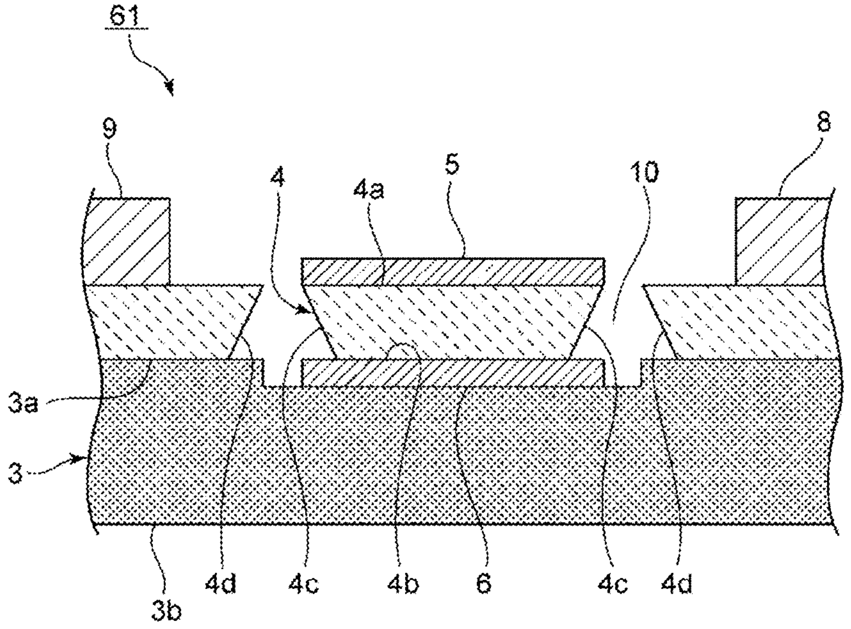
FIG. 8 is a partial cutaway front sectional view for describing a main portion of an acoustic wave device according to a six exemplary embodiment of the present disclosure.

FIG. 8 is a partial cutaway front sectional view for describing a main portion of an acoustic wave device according to a six exemplary embodiment of the present disclosure.

In an acoustic wave device 61, the first end surface 4*c* of the piezoelectric film 4 is an inclined surface within the groove portion 10. In addition, the second end surface 4*d* of the piezoelectric film 4 located outside the exciting portion is also an inclined surface. As described above, the first and second end surfaces 4*c* and 4*d* that form the groove portion 10 may be inclined surfaces.

In the acoustic wave device 61, the first end surface 4*c* and the second end surface 4*d* are inclined away from each other toward the second main surface 4*b* of the piezoelectric film 4 from the first main surface 4*a* of the piezoelectric film 4.

Figure 9:
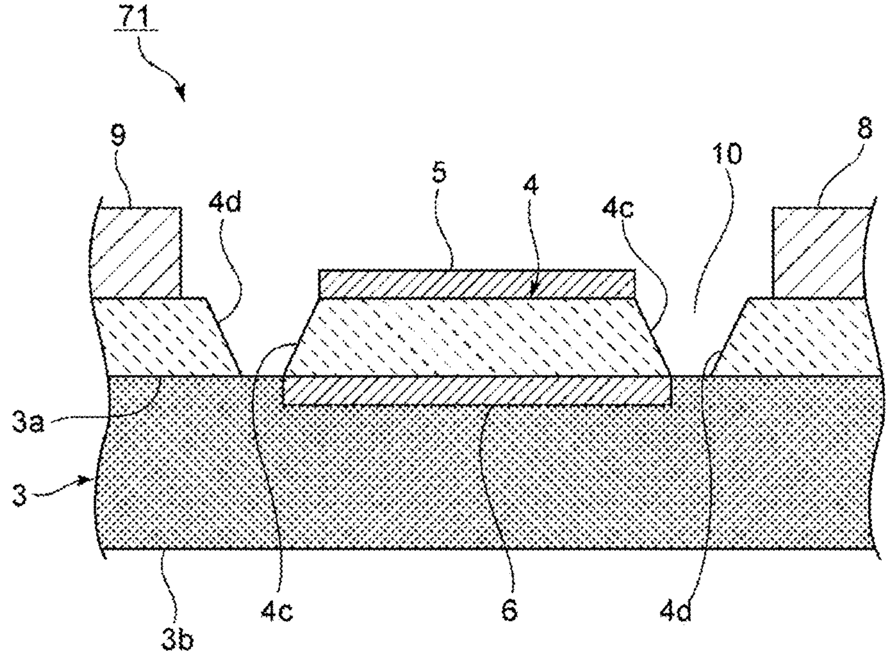
FIG. 9 is a partial cutaway front sectional view for describing a main portion of an acoustic wave device according to a seventh exemplary embodiment of the present disclosure.

FIG. 9 is a partial cutaway front sectional view for describing a main portion of an acoustic wave device according to a seventh exemplary embodiment of the present disclosure.

In an acoustic wave device 71, the first and second end surfaces 4*c* and 4*d* are inclined oppositely to those of the acoustic wave device 61 illustrated in FIG. 8. That is, the first and second end surfaces 4*c* and 4*d* are inclined surfaces, but the distance between the first end surface 4*c* and the second main surface 4*d* is smaller toward the second main surface 4*b* of the piezoelectric film 4 from the first main surface 4*a* of the piezoelectric film 4.

As described above, the directions in which the first and second end surfaces 4*c* and 4*d* constituting the groove portion 10 are inclined may be any of the directions in FIGS. 8 and 9. When the first and second end surfaces 4*c* and 4*d* that form the groove portion 10 are inclined surfaces, since the phases of unnecessary modes reflected by the two end surfaces 4*c* and 4*d* of the groove portion 10 vary to cancel each other, the unnecessary modes are likely to be reduced.

It should be noted that, in FIGS. 8 and 9, the absolute value of the angle formed by the first end surface 4*c* and the first main surface 4*a* of the piezoelectric film 4 is equal to the absolute value of the angle formed by the second end surface 4*d* and the first main surface 4*a*. That is, the groove portion 10 has an isosceles trapezoidal shape in sectional view in FIGS. 8 and 9. However, the absolute values of the inclination angles of the first and second end surfaces 4*c* and 4*d* may differ from each other as one of ordinary skill will recognize.

Figure 10:
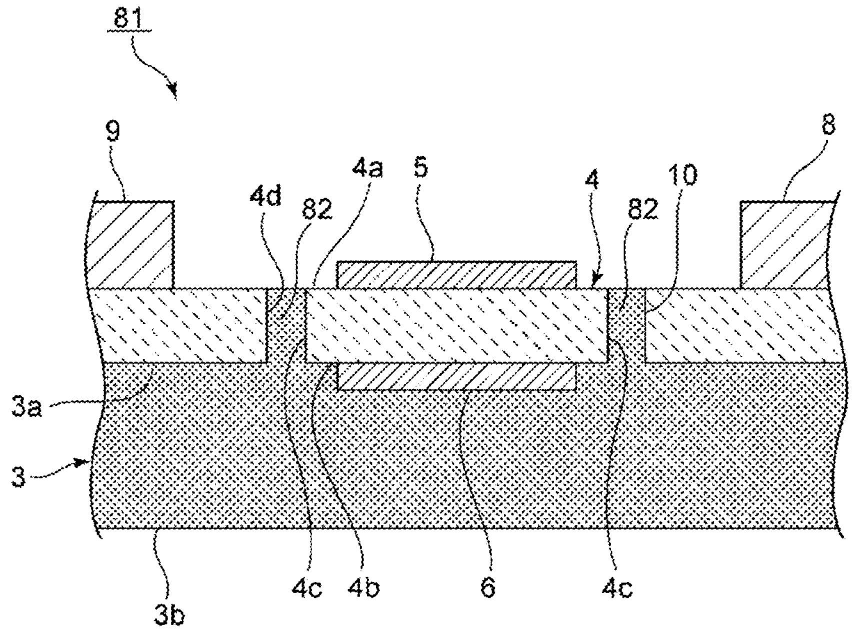
FIG. 10 is a partial cutaway front sectional view for describing a main portion of an acoustic wave device according to an eighth exemplary embodiment of the present disclosure.

FIG. 10 is a partial cutaway front sectional view for describing a main portion of an acoustic wave device according to an eighth exemplary embodiment of the present disclosure.

An acoustic wave device 81 has a dielectric material 82 in the groove portion 10. Although not particularly limited, in the exemplary embodiment, the material of the dielectric material 82 is identical to the material of the intermediate film 3. That is, the groove portion 10 can be easily filled with the dielectric material 82 by, for example, laminating the intermediate film 3 after the groove portion 10 is formed.

As in the exemplary embodiment, the groove portion 10 may be filled with the dielectric material 82. In this case, mechanical strength can be further enhanced.

It should be noted that the dielectric material 82 is not particularly limited, and various dielectrics, such as silicon oxide and alumina, may be used. Preferably, the dielectric material may have a Young's modulus lower than that of the piezoelectric film 4. As a result, characteristics can be improved with certainty.

Figure 11:
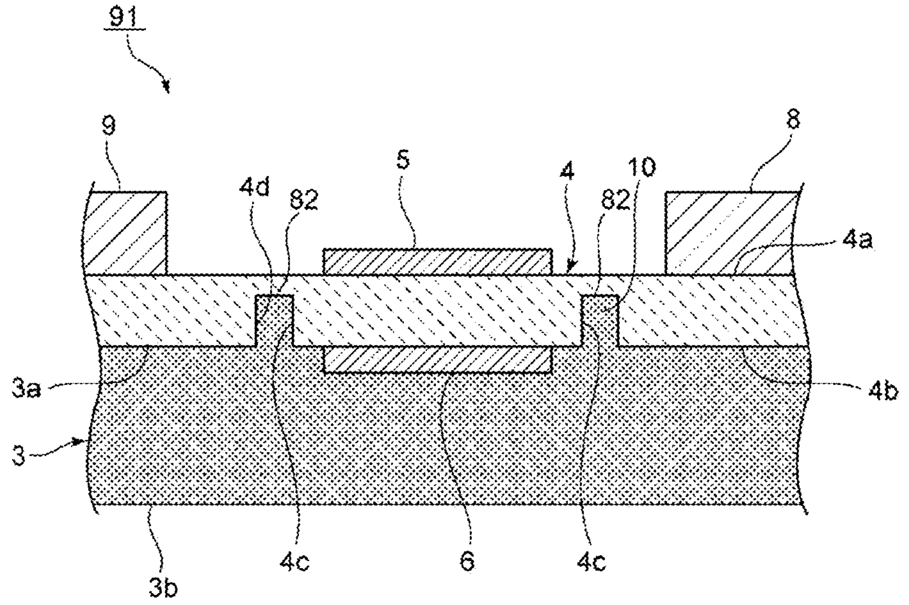
FIG. 11 is a partial cutaway front sectional view for describing a main portion of an acoustic wave device according to a ninth embodiment of the present invention.

In addition, in the acoustic wave device 81, the groove portion 10 passes through the piezoelectric film 4, and the upper surface of the dielectric material 82 is exposed on the first main surface 4*a* of the piezoelectric film 4. In contrast, as illustrated in FIG. 11, the groove portion 10 extends from the second main surface 4*b* of the piezoelectric film 4 toward the first main surface 4*a* of the piezoelectric film 4, but the groove portion 10 need not reach the first main surface 4*a*. Even in this case, the groove portion 10 can be easily filled with the dielectric material 82 by the manufacturing method described above.

It should be noted that the groove portion 10 is filled with the dielectric material 82 in an acoustic wave device 91, but the groove portion 10 need not be filled with the dielectric material 82.

In addition, the groove portion 10 is fully filled with the dielectric material 82 in the acoustic wave devices 81 and 91, but the groove portion 10 may be partially filled with the dielectric material 82. For example, the upper surface of the dielectric material 82 may be located below the upper end of the groove portion 10. In addition, the dielectric material 82 may be laminated on the first end surface 4*c* or the second end surface 4*d*, and a cavity surrounded by the dielectric material 82 may be present.

Figure 12:
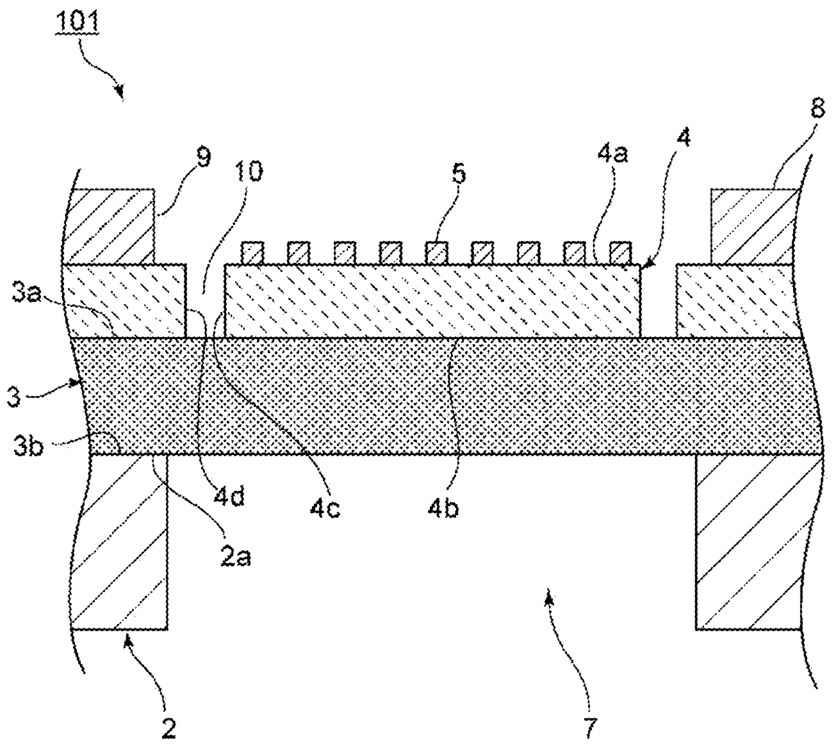
FIG. 12 is a partial cutaway front sectional view for describing a main portion of an acoustic wave device according to a tenth exemplary embodiment of the present disclosure.

FIG. 12 is a partial cutaway front sectional view for describing a main portion of an acoustic wave device according to a tenth exemplary embodiment of the present disclosure.

In an acoustic wave device 101, the first electrode 5 is an interdigital transducer (IDT) electrode and the second electrode is not provided. As described above, the acoustic wave device according to the present disclosure need not have the second electrode. In this case, application of an AC electric field to the IDT electrode as the first electrode 5 excites the piezoelectric film 4, and the resonance characteristics or the like in accordance with the excited acoustic wave can be used. In the acoustic wave device 101 according to the exemplary embodiment as well, since the groove portion 10 that does not to reach the void portion 7 is provided, characteristics can be improved and mechanical strength can be enhanced.

Figure 13A:
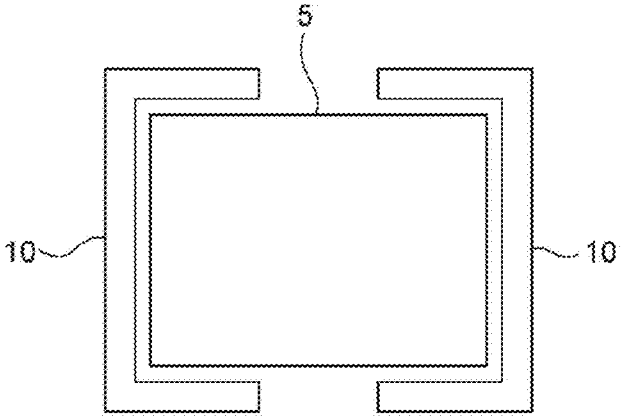
FIG. 13A is a schematic plan view for describing modifications of the planar shape of a groove portion of the acoustic wave device according to the present disclosure.
Figure 13B:
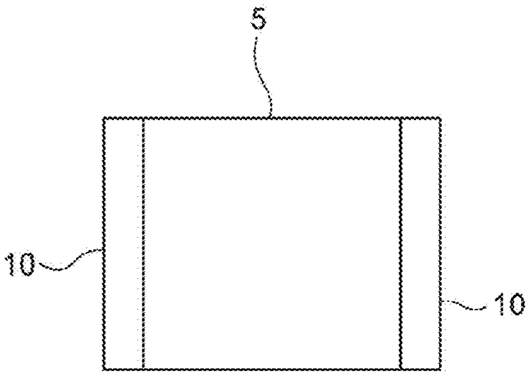
FIG. 13B is another schematic plan view for describing modifications of the planar shape of a groove portion of the acoustic wave device according to the present disclosure.
Figure 13C:
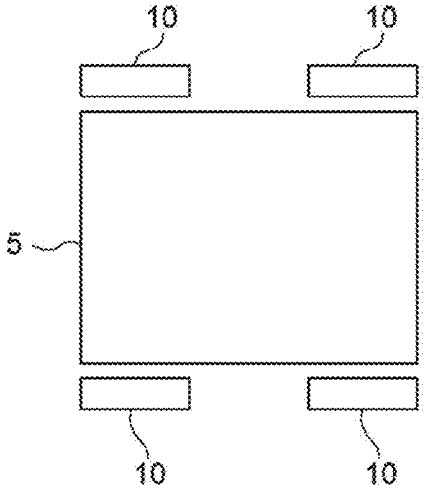
FIG. 13C is a further schematic plan view for describing modifications of the planar shape of a groove portion of the acoustic wave device according to the present disclosure.

FIGS. 13A to 13C are schematic plan views for describing modifications of the planar shape of a groove portion of the acoustic wave device according to the present disclosure.

In FIG. 13A, the groove portion 10 having a substantially frame-like shape is provided so as to surround the rectangular first electrode 5. That is, a pair of groove portions 10 each extending from one short side of the rectangular first electrode 5 to some portions of both long sides is provided. In FIG. 13A, a space is provided between the groove portions 10 and the outer peripheral edge of the first electrode 5. That is, the groove portion 10 is in contact with the outer peripheral edge of the first electrode 5 in the acoustic wave device 1 illustrated in FIG. 1A, but the groove portion 10 may be away from the outer peripheral edge of the first electrode 5 as described above.

Alternatively, as illustrated in FIG. 13B, a pair of groove portions 10 and 10 may be in contact with the pair of short sides of the rectangular first electrode 5. In this case, each of the groove portions 10 has only a portion extending along the short side of the rectangular first electrode 5. As described above, the groove portion 10 may be provided along only one side of the first electrode 5.

Furthermore, in FIG. 13C, a plurality of groove portions 10 are provided along one long side of the rectangular first electrode 5, and a plurality of groove portions 10 are provided along the other long side. As described above, the plurality of groove portions 10 and 10 may be provided along one side of the first electrode 5.

As illustrated in FIGS. 13A to 13C, the planar shape of the groove portion 10 according to the present disclosure may be variously modified. In addition, the substantially frame-like shape is the frame shape excluding the extracted electrode portions because the groove portion is to be provided so as to avoid the extracted electrode portions of the first electrode and the second electrode.

REFERENCE SIGNS LIST

1, 21, 31, 41, 51, 61, 71, 81, 91, 101 acoustic wave device
2 support substrate
2A support substrate material
2*a* upper surface
3 intermediate film
3*a* upper surface
3*b* lower surface
4 piezoelectric film
4*a*, 4*b* first and second main surfaces
4A piezoelectric wafer
4*c*, 4*d* first and second end surface
5 first electrode
5*a* drawn electrode portion
6 second electrode
6*a* drawn electrode portion
7 void portion
8, 9 terminal electrode
10 groove portion
82 dielectric material

The invention claimed is:

1. An acoustic wave device comprising:
a support substrate;
an intermediate film provided on the support substrate;
a piezoelectric film provided on the intermediate film, the piezoelectric film having a first main surface and a second main surface that face away from the first main surface; and
a first electrode provided on the first main surface of the piezoelectric film,
wherein, in plan view from the first main surface of the piezoelectric film, on a side of the second main surface of the piezoelectric film, a void portion is provided to overlap at least a part of the first electrode, and a groove portion is provided to pass through at least a part of the piezoelectric film but not reach the void portion,
the groove portion is provided within a region that overlaps the void portion in the plan view, and
the intermediate film is located below the groove portion.

2. The acoustic wave device according to claim 1, wherein the groove portion reaches an inside of the intermediate film.

3. The acoustic wave device according to claim 1, wherein the groove portion is located in the piezoelectric film.

4. The acoustic wave device according to claim 1, wherein the piezoelectric film has a first end surface and a second end surface that constitute the groove portion, the first end surface being located on a side of the first electrode, the second end surface being located on a side opposite to the first electrode, and the first end surface is flush with a part of a side surface of the first electrode.

5. The acoustic wave device according to claim 4, wherein the first end surface is an inclined surface that is inclined with respect to a direction of a line normal to the first main surface of the piezoelectric film.

6. The acoustic wave device according to claim 5, wherein the inclined surface is further inclined to an inner side of the first electrode toward the second main surface of the piezoelectric film from the first main surface of the piezoelectric film.

7. The acoustic wave device according to claim 5, wherein the inclined surface is further inclined to an outer side of the first electrode toward the second main surface of the piezoelectric film from the first main surface of the piezoelectric film.

8. The acoustic wave device according to claim 1, wherein the piezoelectric film has a first end surface and a second end surface that constitute the groove portion, the first end surface being located on a side of the first electrode, the second end surface being located on a side opposite to the first electrode, and the first end surface is located outside an outer peripheral edge of the first electrode.

9. The acoustic wave device according to claim 1, wherein the piezoelectric film has a first end surface and a second end surface that constitute the groove portion, the first end surface being located on a side of the first electrode, the second end surface being located on a side opposite to the first electrode, and the first end surface is located inside an outer peripheral edge of the first electrode.

10. The acoustic wave device according to claim 1, wherein the groove portion extends from the first main surface of the piezoelectric film toward the second main surface of the piezoelectric film.

11. The acoustic wave device according to claim 1, wherein the groove portion extends from the second main surface of the piezoelectric film toward the first main surface of the piezoelectric film.

12. The acoustic wave device according to claim 11, wherein a dielectric material is provided in the groove portion.

13. The acoustic wave device according to claim 12, wherein a material of the dielectric material is identical to a material of the intermediate film.

14. The acoustic wave device according to claim 1, wherein at least a part of the groove portion is disposed in a cleavage plane of the piezoelectric film in plan view.

15. The acoustic wave device according to claim 1, wherein the intermediate film contains silicon oxide.

16. The acoustic wave device according to claim 1, wherein the first electrode is an interdigital transducer (IDT) electrode.

17. The acoustic wave device according to claim 1, wherein a second electrode is provided on the second main surface of the piezoelectric film.

18. The acoustic wave device according to claim 1, wherein the piezoelectric film is made of one material selected from a group including lithium niobate, lithium tantalate, and quartz.

* * * * *